(12) United States Patent
Kim et al.

(10) Patent No.: US 8,101,965 B2
(45) Date of Patent: Jan. 24, 2012

(54) III-NITRIDE SEMICONDUCTOR LIGHT EMITTING DEVICE HAVING A MULTILAYERED PAD

(75) Inventors: Chang Tae Kim, Seongnam-si (KR); Hyun Su An, Gumi-si (KR); Hyun Suk Kim, Seongnam-si (KR)

(73) Assignee: Epivalley Co., Ltd., Gumi (KR)

( * ) Notice: Subject to any disclaimer, the term of this patent is extended or adjusted under 35 U.S.C. 154(b) by 0 days.

(21) Appl. No.: 12/648,707

(22) Filed: Dec. 29, 2009

(65) Prior Publication Data

US 2010/0133579 A1   Jun. 3, 2010

Related U.S. Application Data

(63) Continuation of application No. PCT/KR2009/007169, filed on Dec. 2, 2009.

(30) Foreign Application Priority Data

Dec. 2, 2008   (KR) ..................... 10-2008-0121156

(51) Int. Cl.
| | |
|---|---|
| H01L 29/22 | (2006.01) |
| H01L 33/00 | (2010.01) |
| H01L 29/24 | (2006.01) |
| H01L 27/15 | (2006.01) |
| H01L 29/18 | (2006.01) |
| H01L 31/12 | (2006.01) |
| H01L 29/26 | (2006.01) |
| H01L 29/06 | (2006.01) |
| H01L 31/0328 | (2006.01) |
| H01L 31/0336 | (2006.01) |
| H01L 31/072 | (2006.01) |
| H01L 31/109 | (2006.01) |

(52) U.S. Cl. ............... 257/99; 257/13; 257/79; 257/87; 257/94; 257/103; 257/E33.062; 257/E33.063; 257/E33.065; 257/E33.066

(58) Field of Classification Search ................. 257/13, 257/79, 87, 94, 103, E33.062, E33.063, E33.065, 257/E33.066, 99
See application file for complete search history.

(56) References Cited

U.S. PATENT DOCUMENTS

| | | | | |
|---|---|---|---|---|
| 4,447,825 | A | * | 5/1984 | Oana et al. .................. 257/743 |
| 5,122,845 | A | | 6/1992 | Manabe et al. ................ 117/95 |
| 5,247,533 | A | | 9/1993 | Okazaki et al. ............ 372/45.01 |
| 5,290,393 | A | | 3/1994 | Nakamura ...................... 257/13 |
| 5,306,662 | A | | 4/1994 | Nakamura et al. ............ 438/509 |
| 5,412,249 | A | * | 5/1995 | Hyugaji et al. ............... 257/745 |
| 5,563,422 | A | | 10/1996 | Nakamura et al. .............. 257/13 |

(Continued)

FOREIGN PATENT DOCUMENTS

JP        08274372 A    * 10/1996

(Continued)

*Primary Examiner* — Ida M Soward
(74) *Attorney, Agent, or Firm* — Harness, Dickey & Pierce, P.L.C.

(57) ABSTRACT

The present disclosure relates to a III-nitride semiconductor light-emitting device including: a plurality of III-nitride semiconductor layers having a first III-nitride semiconductor layer having a first conductivity type, a second III-nitride semiconductor layer having a second conductivity type different from the first conductivity type, and an active layer disposed between the first III-nitride semiconductor layer and the second III-nitride semiconductor layer and generating light by recombination of electrons and holes; a bonding pad electrically connected to the plurality of III-nitride semiconductor layers; a protection film disposed over the bonding pad; and a buffer pad disposed between the bonding pad and the protection film and formed to expose the bonding pad.

8 Claims, 5 Drawing Sheets

U.S. PATENT DOCUMENTS

| | | | |
|---|---|---|---|
| 5,733,796 A | 3/1998 | Manabe et al. | 117/95 |
| 6,194,743 B1 | 2/2001 | Kondoh et al. | 257/94 |
| 6,515,306 B2 | 2/2003 | Kuo et al. | 257/82 |
| 6,620,643 B1 * | 9/2003 | Koike | 438/30 |
| 6,674,097 B2 * | 1/2004 | Komoto et al. | 257/98 |
| 6,794,690 B2 * | 9/2004 | Uemura | 257/183 |
| 6,867,058 B2 * | 3/2005 | Uemura et al. | 438/46 |
| 6,955,936 B2 * | 10/2005 | Uemura et al. | 438/46 |
| 7,498,244 B2 | 3/2009 | Jeon et al. | 438/483 |
| 7,554,125 B2 * | 6/2009 | Kwak | 257/79 |
| 7,601,553 B2 | 10/2009 | Yoo et al. | 438/47 |
| 7,684,459 B2 * | 3/2010 | Mukoyama et al. | 372/87 |
| 2007/0218601 A1 * | 9/2007 | Seo et al. | 438/151 |
| 2008/0296601 A1 * | 12/2008 | Chyi et al. | 257/98 |
| 2009/0212276 A1 * | 8/2009 | Hong et al. | 257/13 |
| 2009/0295902 A1 * | 12/2009 | Sato et al. | 347/224 |
| 2010/0213485 A1 * | 8/2010 | McKenzie et al. | 257/98 |
| 2010/0283070 A1 * | 11/2010 | Kim et al. | 257/98 |

FOREIGN PATENT DOCUMENTS

JP         2007243074 A   *   9/2007

* cited by examiner

III-NITRIDE SEMICONDUCTOR LIGHT EMITTING DEVICE HAVING A MULTILAYERED PAD

CROSS-REFERENCE TO RELATED APPLICATIONS

This application is a continuation of PCT Application No. PCT/KR2009/007169 filed on Dec. 2, 2009, which claims the benefit and priority to Korean Patent Application No. 10-2008-0121156, filed Dec. 2, 2008. The entire disclosures of the applications identified in this paragraph are incorporated herein by reference.

FIELD

The present disclosure relates generally to a III-nitride semiconductor light-emitting device, and, more particularly, to a III-nitride semiconductor light-emitting device which can prevent a loss of a bonding pad-side protection film.

The III-nitride semiconductor light-emitting device means a light-emitting device, such as a light-emitting diode including a compound semiconductor layer composed of $Al_{(x)}Ga_{(y)}In_{(1-x-y)}N$ ($0 \leq x \leq 1$, $0 \leq y \leq 1$, $0 \leq x+y \leq 1$), and may further include a material composed of other group elements, such as SiC, SiN, SiCN and CN, and a semiconductor layer made of such materials.

BACKGROUND

This section provides background information related to the present disclosure which is not necessarily prior art.

FIG. 1 is a view illustrating one example of a conventional III-nitride semiconductor light-emitting device. The III-nitride semiconductor light-emitting device includes a substrate 100, a buffer layer 200 grown on the substrate 100, an n-type III-nitride semiconductor layer 300 grown on the buffer layer 200, an active layer 400 grown on the n-type III-nitride semiconductor layer 300, a p-type III-nitride semiconductor layer 500 grown on the active layer 400, a p-side electrode 600 formed on the p-type III-nitride semiconductor layer 500, a p-side bonding pad 700 formed on the p-side electrode 600, an n-side electrode 800 formed on the n-type III-nitride semiconductor layer exposed by mesa-etching the p-type III-nitride semiconductor layer 500 and the active layer 400, and a protective film 900.

In the case of the substrate 100, a GaN substrate can be used as a homo-substrate. A sapphire substrate, a SiC substrate or a Si substrate can be used as a hetero-substrate. However, any type of substrate that can have a nitride semiconductor layer grown thereon can be employed. In the case that the SiC substrate is used, the n-side electrode 800 can be formed on the surface of the SiC substrate.

The nitride semiconductor layers epitaxially grown on the substrate 100 are usually grown by metal organic chemical vapor deposition (MOCVD).

The buffer layer 200 serves to overcome differences in lattice constant and thermal expansion coefficient between the hetero-substrate 100 and the nitride semiconductor layers. U.S. Pat. No. 5,122,845 describes a technique of growing an AlN buffer layer with a thickness of 100 to 500 Å on a sapphire substrate at 380 to 800° C. In addition, U.S. Pat. No. 5,290,393 describes a technique of growing an $Al_{(x)}Ga_{(1-x)}N$ ($0 \leq x < 1$) buffer layer with a thickness of 10 to 5000 Å on a sapphire substrate at 200 to 900° C. Moreover, U.S. Publication No. 2006/154454 describes a technique of growing a SiC buffer layer (seed layer) at 600 to 990° C., and growing an $In_{(x)}Ga_{(1-x)}N$ ($0 < x \leq 1$) thereon. In particular, it is provided with an undoped GaN layer with a thickness of 1 micron to several microns (μm) on the AlN buffer layer, the $Al_{(x)}Ga_{(1-x)}N$ ($0 \leq x < 1$) buffer layer or the $SiC/In_{(x)}Ga_{(1-x)}N$ ($0 < x \leq 1$) layer.

In the n-type nitride semiconductor layer 300, at least the n-side electrode 800 formed region (n-type contact layer) is doped with a dopant. In some embodiment, the n-type contact layer is made of GaN and doped with Si. U.S. Pat. No. 5,733,796 describes a technique of doping an n-type contact layer at a target doping concentration by adjusting the mixture ratio of Si and other source materials.

The active layer 400 generates light quanta by recombination of electrons and holes. For example, the active layer 400 contains $In_{(x)}Ga_{(1-x)}N$ ($0 < x \leq 1$) and has a single layer or multi-quantum well layers.

The p-type III-nitride semiconductor layer 500 is doped with an appropriate dopant such as Mg, and has p-type conductivity by an activation process. U.S. Pat. No. 5,247,533 describes a technique of activating a p-type nitride semiconductor layer by electron beam irradiation. Moreover, U.S. Pat. No. 5,306,662 describes a technique of activating a p-type III-nitride semiconductor layer by annealing over 400° C. U.S. Publication No. 2006/157714 describes a technique of endowing a p-type nitride semiconductor layer with p-type conductivity without an activation process, by using ammonia and a hydrazine-based source material together as a nitrogen precursor for growing the p-type nitride semiconductor layer.

The p-side electrode 600 is provided to facilitate current supply to the p-type III-nitride semiconductor layer 500. U.S. Pat. No. 5,563,422 describes a technique associated with a light-transmitting electrode composed of Ni and Au formed over almost the entire surface of the p-type nitride semiconductor layer 500 and in ohmic-contact with the p-type III-nitride semiconductor layer 500. In addition, U.S. Pat. No. 6,515,306 describes a technique of forming an n-type superlattice layer on a p-type nitride semiconductor layer, and forming a light-transmitting electrode made of indium tin oxide (ITO) thereon.

The p-side electrode 600 can be formed so thick as to not transmit but rather to reflect light toward the substrate 100. This technique is called the flip chip technique. U.S. Pat. No. 6,194,743 describes a technique associated with an electrode structure including an Ag layer with a thickness over 20 nm, a diffusion barrier layer covering the Ag layer, a bonding layer containing Au and Al, and covering the diffusion barrier layer.

The p-side bonding pad 700 and the n-side electrode 800 are provided for current supply and external wire-bonding. U.S. Pat. No. 5,563,422 describes a technique of forming an n-side electrode with Ti and Al.

The protection film 900 can be made of $SiO_2$. U.S. Pat. No. 5,563,422 describes a technique for forming a transparent and electrically insulative protective film between a p-side bonding pad and an n-side electrode, or on the top surface of a light-emitting device other than the p-side bonding pad and a wire bonding portion of the n-side electrode.

The n-type nitride semiconductor layer 300 or the p-type nitride semiconductor layer 500 can be constructed as a single layer or as plural layers. Vertical light-emitting devices are introduced by separating the substrate 100 from the nitride semiconductor layers using a laser technique or wet etching.

FIG. 2 is a photograph of an example of the bonding pad-side protection film of the conventional III-nitride semiconductor light-emitting device. Because of poor adhesion between the p-side bonding pad 700 and the protection film 900, the protection film 900 is easily broken or separated (A).

Bonding a wire to the bonding pad 700 for package fabrication may cause a connection defect between the bonding pad 700 and the wire.

SUMMARY

This section provides a general summary of the disclosure, and is not a comprehensive disclosure of its full scope or all of its features.

There is provided a III-nitride semiconductor light-emitting device, including: a plurality of III-nitride semiconductor layers having a first III-nitride semiconductor layer having a first conductivity type, a second III-nitride semiconductor layer having a second conductivity type different from the first conductivity type, and an active layer disposed between the first III-nitride semiconductor layer and the second III-nitride semiconductor layer and generating light by recombination of electrons and holes; a bonding pad electrically connected to the plurality of III-nitride semiconductor layers; a protection film disposed on the bonding pad; and a buffer pad disposed between the bonding pad and the protection film and formed to expose the bonding pad.

According to a III-nitride semiconductor light-emitting device of the present disclosure, the adhesion between the bonding pad and the protection film can be improved.

Also, according to III-nitride semiconductor light-emitting device of the present disclosure, the wire can be bonded to the bonding pad and improve the adhesion between the bonding pad and the protection film at the same time.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Hereinafter, the present disclosure will be described in detail with reference to the accompanying drawings.

Figure 1:
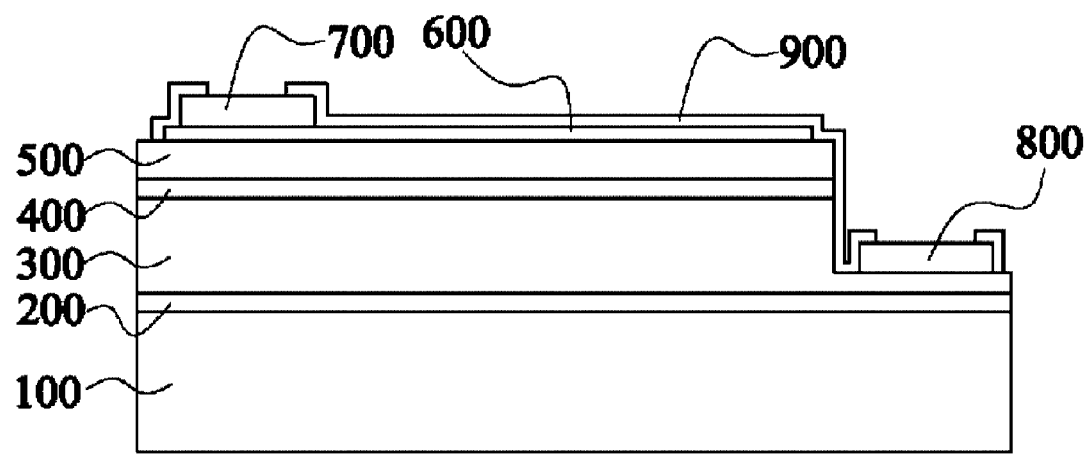
FIG. 1 is a view of an example of a conventional III-nitride semiconductor light-emitting device.
Figure 2:
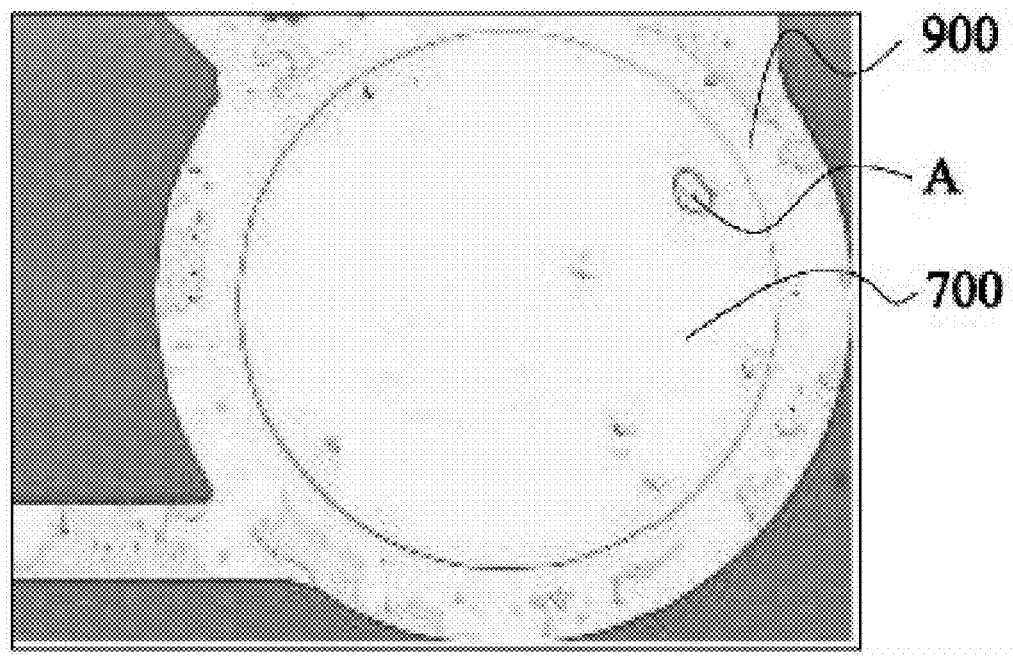
FIG. 2 is a photograph of an example of a bonding pad-side protection film of the conventional III-nitride semiconductor light-emitting device.
Figure 3:
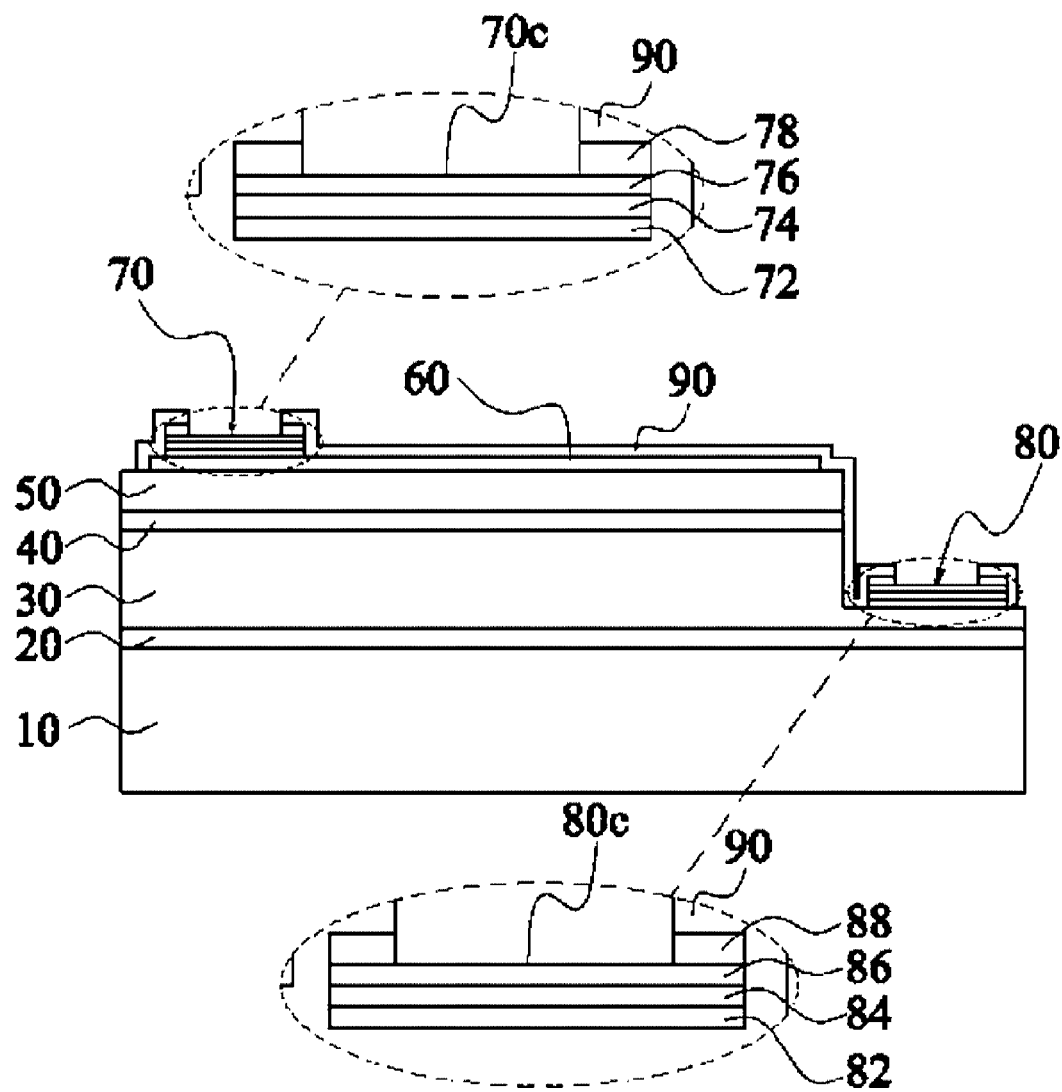
FIG. 3 is a view of an embodiment of a III-nitride semiconductor light-emitting device according to the present disclosure.

FIG. 3 is a view of an embodiment of a III-nitride semiconductor light-emitting device according to the present disclosure. The III-nitride semiconductor light-emitting device includes a substrate 10, a buffer layer 20 grown on the substrate 10, an n-type III-nitride semiconductor layer 30 grown on the buffer layer 20, an active layer 40 grown on the n-type III-nitride semiconductor layer 30 and generating light by recombination of electrons and holes, a p-type III-nitride semiconductor layer 50 grown on the active layer 40, a p-side electrode 60 formed on the p-type III-nitride semiconductor layer 50, a p-side bonding pad 70 formed on the p-side electrode 60, an n-side electrode 80 formed on the n-type III-nitride semiconductor layer 30 exposed by etching at least the p-type III-nitride semiconductor layer 50 and the active layer 40, buffer pads 78 and 88 formed on the p-side bonding pad 70 and the n-side electrode 80, and a protection film 900 formed on the light-emitting device. Here, the n-side electrode 80 not only supplies electricity to the n-type III-nitride semiconductor layer 30 but also functions as a bonding pad for wire-bonding.

The protection film 90 may be formed of an oxide film, such as, for example, $SiO_2$, $TiO_2$ and $Al_2O_3$.

The p-side bonding pad 70 is provided for the connection to the p-side electrode 60 and wire-bonding. For example, the p-side bonding pad 70 may be formed of a Cr layer 72, a Ni layer 74, and an Au layer 76 sequentially stacked on the p-side electrode 60.

The buffer pad 78 is provided on the p-side bonding pad 70 to improve low adhesion between the p-side bonding pad 70 and the protection film 90 and formed of a material which can be adhered, or coupled to the p-side bonding pad 70 and the protection film 90. That is, if the p-side bonding pad 70 is formed of a metal and the protection film 90 is formed of an oxide film, then the buffer pad 78 may be formed of an oxidizable metal. For example, if a top surface of the p-side bonding pad 70 is formed of an Au layer 76 and the protection film 90 is formed of $SiO_2$, then the buffer pad 78 may be formed of Ni or Cr, which is an oxidizable metal, to be sufficiently adhered to $SiO_2$ as well as Au.

The buffer pad 78 is formed in an annular shape to expose a central portion 70c of the p-side bonding pad 70 so that bonding can occur between the p-side bonding pad 70 and the wire. In some particular embodiments, the buffer pad 78 is formed at a top outer portion of the p-side bonding pad 70 in order to secure the maximum bonding area between the p-side bonding pad 70 and the wire.

The n-side electrode 80 is provided for the connection to the n-type III-nitride semiconductor layer 30 and wire-bonding. For example, the n-side electrode 80 may be formed of a Cr layer 82, a Ni layer 84, and an Au layer 86 sequentially stacked on the n-type III-nitride semiconductor layer 30, wherein the buffer pad 88 formed on the n-side electrode 80 may have the same structure as that of the buffer pad 78 formed on the p-side bonding pad 70.

The protection film 90 is formed over the buffer pads 78 and 88 on the light-emitting device, wherein the p-side bonding pad 70 remains exposed by the buffer pad 78 and the n-side electrode 80 remain exposed by the buffer pad 88 so that wire-bonding can occur to the p-side bonding pad 70 and the n-side electrode 80.

Hereinafter, a method for fabricating a III-nitride semiconductor light-emitting device according to the present disclosure will be described in detail.

Figure 4:
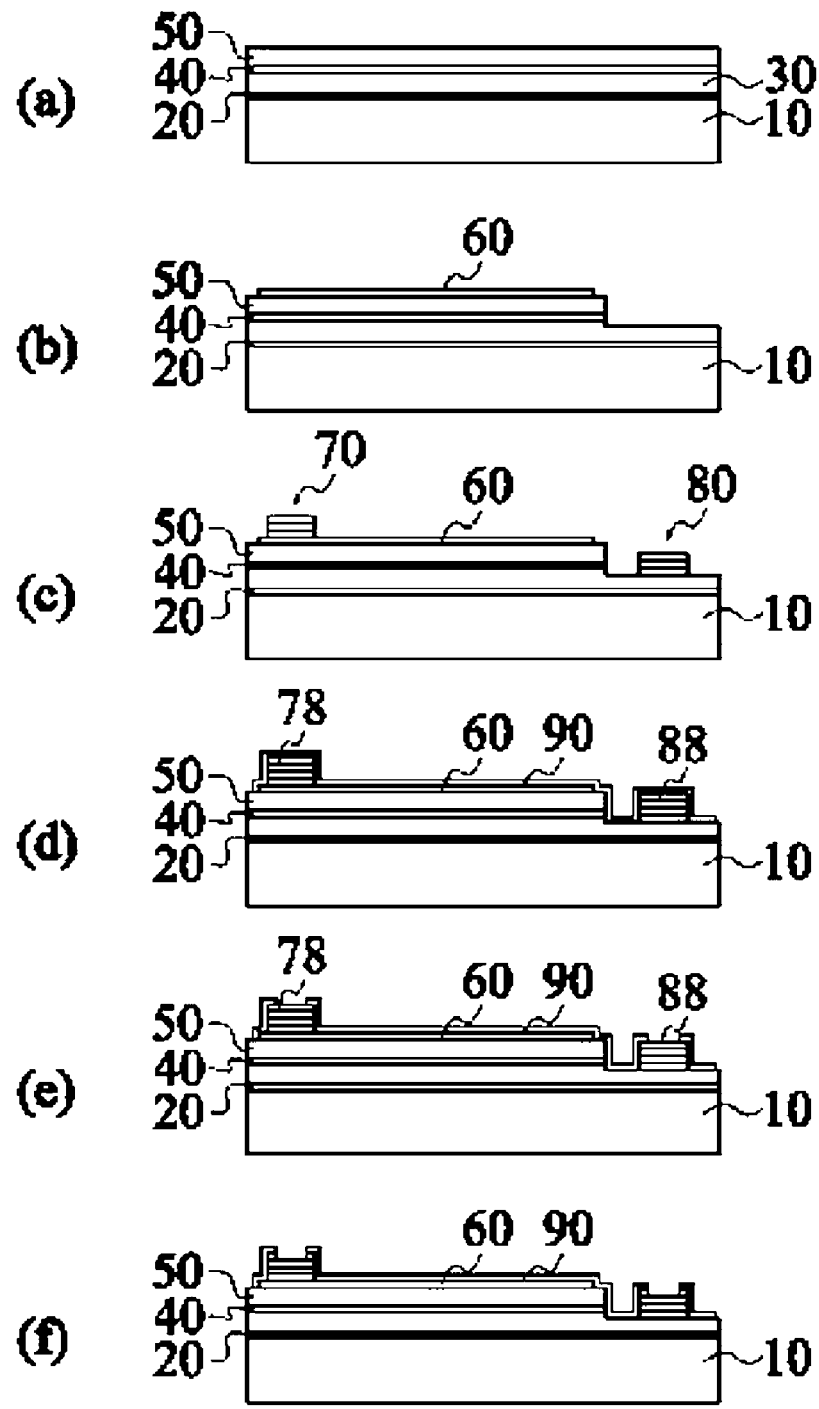
FIG. 4 is a view of an embodiment of a method for fabricating a III-nitride semiconductor light-emitting device according to the present disclosure.

FIG. 4 is a view of an embodiment of a method for fabricating a III-nitride semiconductor light-emitting device according to the present disclosure.

A plurality of III-nitride semiconductor layers 20, 30, 40, and 50 are grown over a substrate 10 (see FIG. 4(a)).

The p-type III-nitride semiconductor layer 50 and the active layer 40 are etched in order to expose the n-type III-nitride semiconductor layer 30 (see FIG. 4(b)).

A p-side electrode 60 is formed (see FIG. 4(b)). The p-side electrode 60 may be formed on the entire top surface or the partial top surface of the p-type III-nitride semiconductor layer 50. The p-side electrode 60 may be formed prior to the etching of the p-type III-nitride semiconductor layer 50 and the active layer 40.

A p-side bonding pad 70 and an n-side electrode 80 are formed (see FIG. 4(c)). Here, the p-side bonding pad 70 and the n-side electrode 80 may be formed by separate processes, respectively. The p-side electrode 60 may be formed by a separate process prior to the etching of the p-type III-nitride semiconductor layer 50 and the active layer 40. For example, the p-side bonding pad 70 may be formed at a thickness of 1 μm to 2 μm by sequentially stacking Cr, Ni, and Au layers on the p-side electrode 60 using electron beam (E-beam) evaporation. The n-side electrode 80 may be formed in the same manner.

A buffer pad 78 is formed on the p-side bonding pad 70 (see FIG. 4(d)). For example, the buffer pad 78 may be formed of a Ni layer having a thickness of 10 Å to 200 Å on the p-side bonding pad 70 using E-beam evaporation. The buffer pad 88 may be formed in the same manner.

A protection film 90 is formed. For example, the protection film 90 may be formed of $SiO_2$, $TiO_2$, and $Al_2O_3$ (see FIG. 4(d)).

Parts of the protection film 90 located on top surfaces of the buffer pads 78 and 88 are removed (see FIG. 4(e)). The protection film 90 may be removed by dry etching or by wet etching. For example, if the protection film 90 is formed of $SiO_2$, it may be dry-etched for about 250 sec. using a gas containing $CF_4$, or wet-etched for about 1 to about 2 min. using a solution containing HF.

The buffer pads 78 and 88 exposed by the removal of the protection film 90 are removed (see FIG. 4(f)). The exposed buffer pads 78 and 88 may be removed by wet etching. For example, if the exposed buffer pads 78 and 88 are formed of a Ni layer, they may be wet-etched for a few tens of seconds using a solution containing HCl.

The resulting structure is subjected to annealing. For example, the resulting structure may be annealed at 425° C. for about 1 min.

Figure 5:
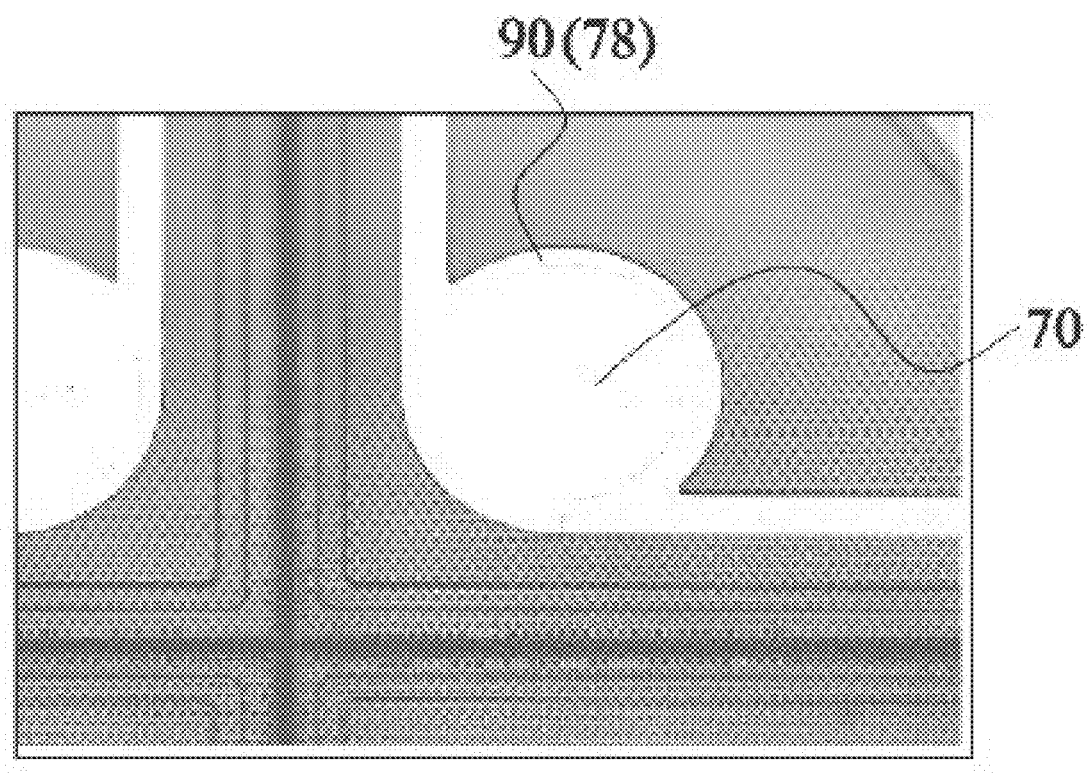
FIG. 5 is a photograph of an example of a bonding pad-side protection film of the III-nitride semiconductor light-emitting device according to the present disclosure.

FIG. 5 is a photograph of an example of the bonding pad-side protection film of the III-nitride semiconductor light-emitting device according to the present disclosure. The p-side bonding pad 70 has the central portion exposed by the buffer pad 78, and the protection film 90 formed on the buffer pad 78 is seldom separated.

Hereinafter, various exemplary embodiments of the present disclosure will be described.

(1) A III-nitride semiconductor light-emitting device including a buffer pad between a protection film and a bonding pad. This prevents an adhesion defect between the bonding pad and the protection film.

(2) A III-nitride semiconductor light-emitting device including a band-shaped pad on a bonding pad. This allows wire-bonding to the bonding pad.

(3) A III-nitride semiconductor light-emitting device including an oxidizable metal layer between a bonding pad and a protection film. This improves the adhesion between the bonding pad formed of a metal layer and the protection film formed of an oxide film.

(4) A III-nitride semiconductor light-emitting device including a Ni layer between a bonding pad and a protection film. This improves the adhesion between the bonding pad formed of a metal layer and the protection film formed of $SiO_2$.

(5) A III-nitride semiconductor light-emitting device including a Cr layer between a bonding pad and a protection film. This improves the adhesion between the bonding pad formed of a metal layer and the protection film formed of $SiO_2$.

The foregoing description of the embodiments has been provided for purposes of illustration and description. It is not intended to be exhaustive or to limit the invention. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the invention, and all such modifications are intended to be included within the scope of the invention.

The terminology used herein is for the purpose of describing particular example embodiments only and is not intended to be limiting. As used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

What is claimed is:

1. A III-nitride semiconductor light-emitting device, comprising:
   a plurality of III-nitride semiconductor layers including a first III-nitride semiconductor layer having a first conductivity type, a second III-nitride semiconductor layer having a second conductivity type different from the first conductivity type, and an active layer disposed between the first III-nitride semiconductor layer and the second III-nitride semiconductor layer and generating light by recombination of electrons and holes;
   a bonding pad electrically connected to the plurality of III-nitride semiconductor layers;
   a buffer pad disposed on the bonding pad, the buffer pad partially exposing the bonding pad; and
   a protection film disposed over the buffer pad and the bonding pad in a manner that the protection film partially exposes the bonding pad for wire-bonding,
   wherein the buffer pad is made of a material which makes adhesion between the buffer pad and the protection film stronger than adhesion between the bonding pad and the protection film.

2. The III-nitride semiconductor light-emitting device of claim 1, wherein the protection film is an oxide film and the buffer pad is formed of an oxidizable metal.

3. The III-nitride semiconductor light-emitting device of claim 1, wherein the protection film is formed of $SiO_2$, a top surface of the bonding pad is formed of Au, and the buffer pad is formed of Ni or Cr.

4. The III-nitride semiconductor light-emitting device of claim 1, wherein the buffer pad is annular in shape.

5. The III-nitride semiconductor light-emitting device of claim 1, wherein, with respect to the plurality of III-nitride semiconductor layers, at least the second III-nitride semiconductor layer and the active layer are etched to expose the first III-nitride semiconductor layer;
   wherein the bonding pad is a first bonding pad electrically connected to the first III-nitride semiconductor layer and the III-nitride semiconductor light-emitting device further comprises a second bonding pad electrically connected to the second III-nitride semiconductor layer;
   wherein the buffer pad is adhered to the protection film and the bonding pad,
   wherein the buffer pad is first a buffer pad formed in a band shape on the first bonding pad to partially expose the first bonding pad and the III-nitride semiconductor light-emitting device further comprises a second buffer pad formed in a band shape on the second bonding pad to partially expose the second bonding pad; and
   wherein the protection film covers the upper portion of the light-emitting device and is formed over the first buffer pad and the second buffer pad in a manner that the protection film exposes the top surface of the first bonding pad exposed by the first buffer pad and the top surface of the second bonding pad exposed by the second buffer pad.

6. The III-nitride semiconductor light-emitting device of claim 5, wherein the protection film is formed of $SiO_2$, a top surface of the bonding pad is formed of Au, and the buffer pad is formed of Ni or Cr.

7. The III-nitride semiconductor light-emitting device of claim 4, wherein the protection film is an oxide film and the buffer pad is formed of an oxidizable metal.

8. The III-nitride semiconductor light-emitting device of claim 4, wherein the protection film is formed of $SiO_2$, a top surface of the bonding pad is formed of Au, and the buffer pad is formed of Ni or Cr.

* * * * *